US012676581B2

(12) United States Patent
Sumiyoshi

(10) Patent No.: US 12,676,581 B2
(45) Date of Patent: Jul. 7, 2026

(54) OUTPHASING AMPLIFIER

(71) Applicant: SUMITOMO ELECTRIC INDUSTRIES, LTD., Osaka (JP)

(72) Inventor: Takashi Sumiyoshi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 438 days.

(21) Appl. No.: 18/540,105

(22) Filed: Dec. 14, 2023

(65) Prior Publication Data

US 2024/0313713 A1 Sep. 19, 2024

(30) Foreign Application Priority Data

Mar. 13, 2023 (JP) ................................. 2023-038274

(51) Int. Cl.
H03F 1/56 (2006.01)
H03F 3/193 (2006.01)
H03F 3/68 (2006.01)
(52) U.S. Cl.
CPC .............. H03F 1/56 (2013.01); H03F 3/193 (2013.01); H03F 3/68 (2013.01); *H03F 2200/222* (2013.01); *H03F 2200/318* (2013.01); *H03F 2200/387* (2013.01); *H03F 2203/21142* (2013.01)
(58) Field of Classification Search
CPC ... H03F 1/56; H03F 3/193; H03F 3/68; H03F 2200/222; H03F 2200/318; H03F 2200/387; H03F 2203/21142; H03F 1/565; H03F 3/195; H03F 3/245; H03F 1/0294; H03F 2200/451

USPC .............................................. 330/124 R, 295
See application file for complete search history.

(56) References Cited

U.S. PATENT DOCUMENTS 5,111,157 A * 5/1992 Komiak .................. H03F 3/604
330/307
2014/0368274 A1 12/2014 Kimura

FOREIGN PATENT DOCUMENTS

JP 2015-002538 A 1/2015
JP 2020-156023 A 9/2020

* cited by examiner

*Primary Examiner* — Khiem D Nguyen
(74) *Attorney, Agent, or Firm* — Volpe Koenig

(57) ABSTRACT

An outphasing amplifier includes first to fourth amplifiers, first and second impedance converters, a first matching circuit, a second matching circuit, a third matching circuit matching output impedance of first impedance converter with input impedance of third amplifier, a fourth matching circuit matching output impedance of second impedance converter with input impedance of fourth amplifier, and a combiner combining the first signal amplified by third amplifier and the second signal amplified by fourth amplifier, wherein a first phase difference of the first signal input to third matching circuit with respect to the first signal output from first matching circuit is less than 90° at a center frequency of an operating frequency band, and a second phase difference of the second signal input to fourth matching circuit with respect to the second signal output from second matching circuit is more than 90° at the center frequency.

10 Claims, 17 Drawing Sheets

OUTPHASING AMPLIFIER

CROSS REFERENCE TO RELATED APPLICATIONS

This application claims priority based on Japanese Patent Application No. 2023-038274 filed on Mar. 13, 2023, and the entire contents of the Japanese patent applications are incorporated herein by reference.

FIELD

The present disclosure relates to an outphasing amplifier.

BACKGROUND

An outphasing amplifier is known as an amplifier for amplifying a high frequency signal such as a microwave. The outphasing amplifier includes a signal processor, two amplifiers and a combiner. The signal processor outputs two signals in which an outphasing angle is changed based on an amplitude of an input signal. The two amplifiers amplify two signals output from the signal processor, respectively. The combiner combines the two output signals amplified by the two amplifiers into one output signal. It is known to use a Chireix combiner as a combiner (for example, Patent Document 1: Japanese Laid-open Patent Publication No. 2020-156023).

SUMMARY

An outphasing amplifier according to the present disclosure includes a first amplifier configured to amplify a first signal; a second amplifier configured to amplify a second signal; a third amplifier configured to amplify the first signal amplified by the first amplifier; a fourth amplifier configured to amplify the second signal amplified by the second amplifier; a first impedance converter configured to have a first end connected to the first amplifier and a second end connected to the third amplifier; a second impedance converter configured to have a first end connected to the second amplifier and a second end connected to the fourth amplifier; a first matching circuit configured to match an output impedance of the first amplifier with an input impedance of the first impedance converter; a second matching circuit configured to match an output impedance of the second amplifier with an input impedance of the second impedance converter; a third matching circuit configured to match an output impedance of the first impedance converter with an input impedance of the third amplifier; a fourth matching circuit configured to match an output impedance of the second impedance converter with an input impedance of the fourth amplifier; and a combiner configured to combine the first signal amplified by the third amplifier and the second signal amplified by the fourth amplifier and output a combined signal as an output signal. A first phase difference of the first signal input to the third matching circuit with respect to the first signal output from the first matching circuit is less than 90° at a center frequency of an operating frequency band, and a second phase difference of the second signal input to the fourth matching circuit with respect to the second signal output from the second matching circuit is more than 90° at the center frequency.

DETAILED DESCRIPTION OF EMBODIMENTS

Figure 1:
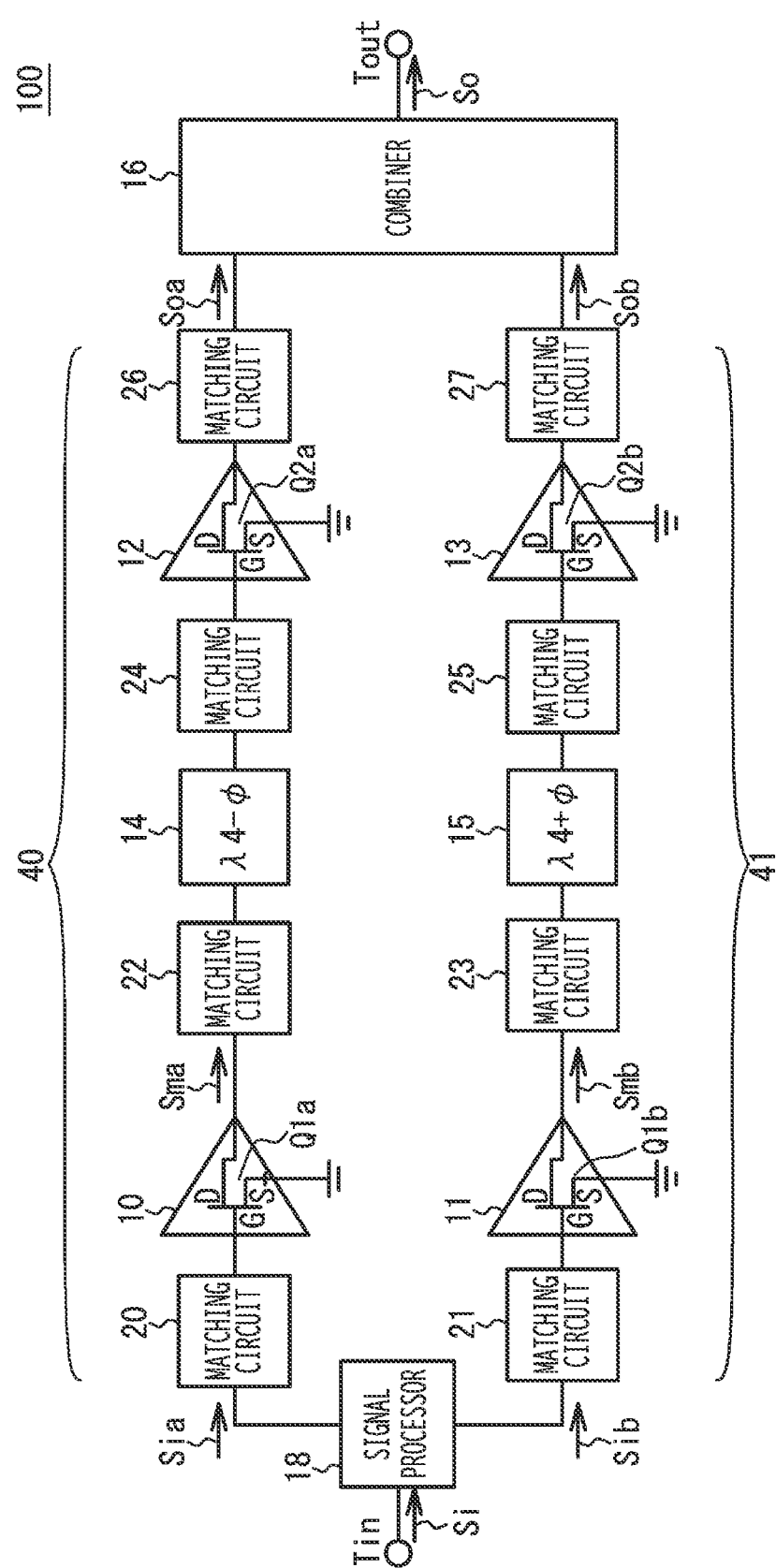
FIG. 1 is a block diagram illustrating an outphasing amplifier according to a first embodiment.

In the outphasing amplifier, each of two amplifiers connected in parallel may be a multiple-stage amplifier. When designing the multi-stage amplifier, a node may be provided between two amplifiers such that an impedance of a post-stage amplifier is substantially equal to a reference impedance, in order to facilitate the design of a matching circuit. In this case, it is conceivable to provide an impedance converter between the amplifiers. However, when the impedance converter is provided between the amplifiers in an outphasing amplifier, the characteristics of the outphasing amplifier are deteriorated.

The present disclosure has been made in view of the above problem, and an object of the present disclosure is to provide an outphasing amplifier that can improve the characteristics.

Details of Embodiments of the Present Disclosure

First, the contents of the embodiments of this disclosure are listed and explained.

(1) An outphasing amplifier according to the present disclosure includes a first amplifier configured to amplify a first signal; a second amplifier configured to amplify a second signal; a third amplifier configured to amplify the first signal amplified by the first amplifier; a fourth amplifier configured to amplify the second signal amplified by the second amplifier; a first impedance converter configured to have a first end connected to the first amplifier and a second end connected to the third amplifier; a second impedance converter configured to have a first end connected to the second amplifier and a second end connected to the fourth amplifier; a first matching circuit configured to match an output impedance of the first amplifier with an input impedance of the first impedance converter; a second matching circuit configured to match an output impedance of the second amplifier with an input impedance of the second impedance converter; a third matching circuit configured to match an output impedance of the first impedance converter with an input impedance of the third amplifier; a fourth matching circuit configured to match an output impedance of the second impedance converter with an input impedance of the fourth amplifier; and a combiner configured to combine the first signal amplified by the third amplifier and the second signal amplified by the fourth amplifier and output a combined signal as an output signal. A first phase difference of the first signal input to the third matching circuit with respect to the first signal output from the first matching circuit is less than 90° at a center frequency of an operating frequency band, and a second phase difference of the second signal input to the fourth matching circuit with respect to the second signal output from the second matching circuit is more than 90° at the center frequency. Thereby, it is possible to suppress the reactance components of the impedance viewed from the first matching circuit to the first impedance converter and the impedance viewed from the second matching circuit to the second impedance converter, and to improve the characteristics of the outphasing amplifier.

(2) In the above (1), when Obo is an outphasing angle in a case where the power of the output signal is a minimum value used for operation, the first phase difference may be 85°–θbo or more and 95°–θbo or less and the second phase difference may be 85°+θbo or more and 95°+θbo or less. Thus, the characteristics at the outphasing angle θbo can be improved.

(3) In the above (1) or (2), an impedance viewed from the third amplifier to the third matching circuit may be rotated clockwise on a Smith chart from a complex conjugate of an impedance viewed from the third matching circuit to the third amplifier, and an impedance viewed from the fourth amplifier to the fourth matching circuit may be rotated counterclockwise on the Smith chart from a complex conjugate of an impedance viewed from the fourth matching circuit to the fourth amplifier. Thereby, the bandwidth of the outphasing amplifier can be increased.

(4) In any one of the above (1) to (3), an insertion loss of the first signal input to the third matching circuit with respect to the first signal output from the first matching circuit may be larger at a high frequency end of the operating frequency band than at a low frequency end of the operating frequency band, and an insertion loss of the second signal input to the fourth matching circuit with respect to the second signal output from the second matching circuit may be smaller at the high frequency end than at the low frequency end. Thereby, the first phase difference can be less than 90° and the second phase difference can be more than 90°.

(5) In the above (4), an insertion loss of the third matching circuit may be smaller at the high frequency end than at the low frequency end, and an insertion loss of the fourth matching circuit may be larger at the high frequency end than at the low frequency end. Thereby, the bandwidth of the outphasing amplifier can be increased.

(6) In any one of the above (1) to (5), when coordinates on a Smith chart of an impedance viewed from the first impedance converter to the third matching circuit are expressed using polar coordinates, a radius vector may be 0.5 or less, and when coordinates on the Smith chart of an impedance viewed from the second impedance converter to the fourth matching circuit are expressed using polar coordinates, a radius vector may be 0.5 or less. This facilitates the design of the matching circuit.

(7) In any one of the above (1) to (6), the first impedance converter may be a first transmission line having an electrical length of ¼ of a wavelength at the center frequency, and the second impedance converter may be a second transmission line having an electrical length of ¼ of a wavelength at the center frequency. Thereby, the first impedance converter and the second impedance converter can be realized.

(8) In the above (7), the outphasing amplifier further may include: a first open stub configured to have a first end connected to a node between the first matching circuit and the first transmission line; and a second open stub configured to have a first end connected to a node between the second matching circuit and the second transmission line. Thereby, the first phase difference can be less than 90° and the second phase difference can be more than 90°.

(9) In the above (7), the outphasing amplifier further may include: a capacitor configured to have a first end connected to a node between the first matching circuit and the first transmission line and a second end connected to a reference potential; and an inductor configured to have a first end connected to a node between the second matching circuit and the second transmission line and a second end connected to the reference potential. Thereby, the first phase difference can be less than 90° and the second phase difference can be more than 90°.

(10) In any one of the above (1) to (6), the first impedance converter may be a first transmission line having an electrical length shorter than ¼ of a wavelength at the center frequency, and the second impedance converter may be a second transmission line having an electrical length longer than ¼ of a wavelength at the center frequency. Thereby, the first phase difference can be less than 90° and the second phase difference can be more than 90°.

Specific examples of an outphasing amplifier according to embodiments of the present disclosure will be described below with reference to the drawings. It should be noted that the present disclosure is not limited to these examples, but is defined by the claims and is intended to include all modifications within the meaning and scope equivalent to the claims.

First Embodiment

FIG. 1 is a block diagram illustrating an outphasing amplifier according to a first embodiment. As illustrated in FIG. 1, in an outphasing amplifier 100, two paths 40 and 41 are connected in parallel between an input terminal Tin and an output terminal Tout. The path 40 is a two stage amplifier including amplifiers 10 and 12, and the path 41 is a two stage amplifier including amplifiers 11 and 13.

A high frequency signal is input to the input terminal Tin as an input signal Si. When the outphasing amplifier 100 is used in mobile communication base stations, the frequencies of the high frequency signals are, for example, 0.5 GHz or more and 10 GHz or less. A signal processor 18 processes the input signal S1 and outputs it as two signals Sia and Sib to the paths 40 and 41, respectively.

The signal Sia is input to the amplifier 10 via a matching circuit 20. The matching circuit 20 matches an output impedance of the signal processor 18 with an input impedance of the amplifier 10. The amplifier 10 amplifies the signal Sia input via the matching circuit 20 and outputs an amplified signal Sma to the amplifier 12 via a matching circuit 22, a phase circuit 14, and a matching circuit 24. The matching circuit 22, the phase circuit 14, and the matching circuit 24 match an output impedance of the amplifier 10 with an input impedance of the amplifier 12. The amplifier 12 amplifies the signal Sma input via the matching circuit 22, the phase circuit 14, and the matching circuit 24, and outputs an amplified signal Soa to a combiner 16 via a matching circuit 26. The matching circuit 26 matches an output impedance of the amplifier 12 with an input impedance of the combiner 16.

The signal Sib is input to the amplifier 11 via a matching circuit 21. The matching circuit 21 matches an output impedance of the signal processor 18 with an input impedance of the amplifier 11. The amplifier 11 amplifies a signal Sib input via the matching circuit 21 and outputs an amplified signal Smb to the amplifier 13 via a matching circuit 23, a phase circuit 15, and a matching circuit 25. The matching circuit 23, the phase circuit 15, and the matching circuit 25 match an output impedance of the amplifier 11 with an input impedance of the amplifier 13. The amplifier 13 amplifies the signal Smb input via the matching circuit 23, the phase circuit 15, and the matching circuit 25, and outputs an amplified signal Sob to the combiner 16 via a matching circuit 27. The matching circuit 27 matches an output impedance of the amplifier 13 with an input impedance of the combiner 16. The combiner 16 combines the signals Soa and Sob. The combined signal is output from the output terminal Tout as an output signal So.

As described above, the amplifier 10 (first amplifier) amplifies the signal Sia (first signal). The amplifier 11 (second amplifier) amplifies the signal Sib (second signal). The amplifier 12 (third amplifier) amplifies the signal Sma amplified by the amplifier 10. The amplifier 13 (fourth amplifier) amplifies the signal Smb amplified by the amplifier 11.

The amplifiers 10 to 13 include, for example, field effect transistors (FETs) Q1a, Q1b, Q2a, and Q2b, respectively. Sources S of the FETs Q1a, Q1b, Q2a, and Q2b are grounded, signals are input to gates G, and amplified signals are output from drains D. Each of the FETs Q1a, Q1b, Q2a, and Q2b is, for example, a gallium nitride high electron mobility transistor (GaN HEMT) or a laterally diffused metal oxide semiconductor (LDMOS). The amplifiers 10 to 13 may include transistors other than the FETs.

A gate bias voltage is applied to the gates G of the FETs Q1a, Q1b, Q2a, and Q2b via bias circuits (not illustrated), and a drain bias voltage is applied to the drains D via bias circuits (not illustrated).

The signal processor 18 is, for example, a Signal Processing Unit, which performs digital processing on the input signal S1 and outputs signals Sia and Sib. The outphasing amplifier 100 outputs the output signal So having an amplitude of output power corresponding to an amplitude of input power of the input signal Si. The signal processor 18 sets an outphasing angle of the signals Sia and Sib depending on the amplitude of the input signal Si in order to output the output signal So depending on the amplitude of the input signal Si.

Figure 2:
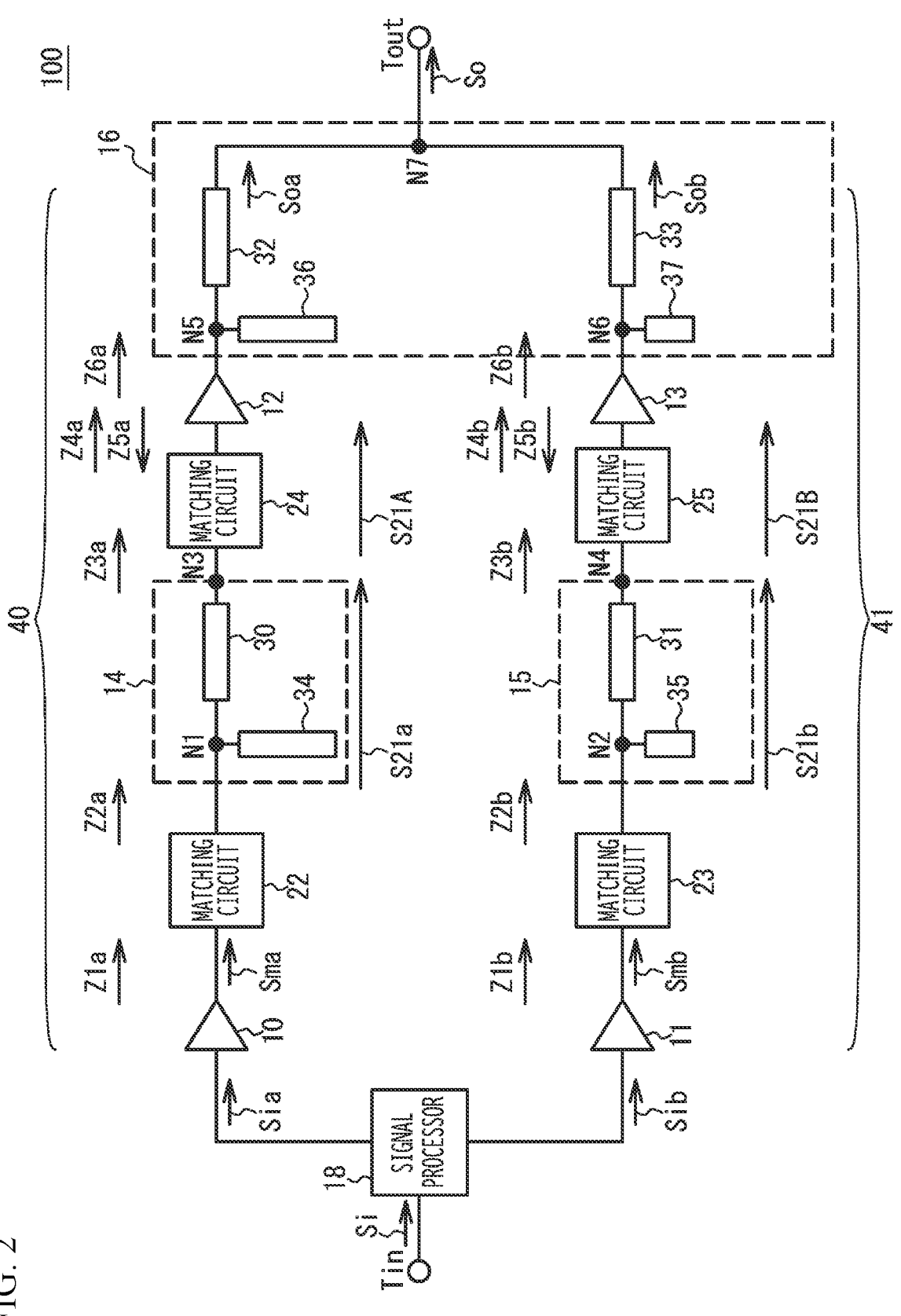
FIG. 2 is a block diagram illustrating an outphasing amplifier according to the first embodiment.

FIG. 2 is a block diagram illustrating the outphasing amplifier according to the first embodiment. In FIG. 2, the matching circuits 20, 21, 26 and 27 are omitted, and the configurations in the phase circuits 14 and 15 and the combiner 16 are illustrated. As illustrated in FIG. 2, in the outphasing amplifier 100 according to the first embodiment, the phase circuit 14 includes a transmission line 30 and an open stub 34, and the phase circuit 15 includes a transmission line 31 and an open stub 35.

In the phase circuit 14, a first end of the transmission line 30 is electrically connected to a node N1, and a second end of the transmission line 30 is electrically connected to a node N3. A first end of the open stub 34 is electrically connected to the node N1, and a second end of the open stub 34 is opened.

In the phase circuit 15, a first end of the transmission line 31 is electrically connected to a node N2, and a second end of the transmission line 31 is electrically connected to a node N4. A first end of the open stub 35 is electrically connected to the node N2, and a second end of the open stub 35 is opened.

That is, in the transmission line 30 (first impedance converter), the first end is connected to the amplifier 10 and the second end is connected to the amplifier 12. In the transmission line 31 (second impedance converter), the first end is connected to the amplifier 11 and the second end is connected to the amplifier 13.

The matching circuit 22 (first matching circuit) matches the output impedance of the amplifier 10 with an input impedance of the transmission line 30. The matching circuit 23 (second matching circuit) matches the output impedance of the amplifier 11 with an input impedance of the transmission line 31. The matching circuit 24 (third matching circuit) matches an output impedance of the transmission line 30 with the input impedance of the amplifier 12. The matching circuit 25 (fourth matching circuit) matches an output impedance of the transmission line 31 with the input impedance of the amplifier 13.

The combiner 16 is a Chireix combiner. The combiner 16 includes transmission lines 32 and 33 and open stubs 36 and 37. A first end of the transmission line 32 is electrically connected to a node N5, and a second end of the transmission line 32 is electrically connected to a node N7. A first end of the transmission line 33 is electrically connected to a node N6, and a second end of the transmission line 33 is electrically connected to the node N7. A first end of the open stub 36 is electrically connected to the node N5, and a second end of the open stub 36 is opened. A first end of the open stub 37 is electrically connected to the node N6, and a second end of the open stub 37 is opened. The signal Soa input to the node N5 and the signal Sob input to the node N6 are combined at the node N7 and the combined signal is outputted to the node Tout as the signal So having a power Po.

Impedances Z1a and Z1b are impedances viewed from the amplifiers 10 and 11 to the matching circuits 22 and 23, respectively. Impedances Z2a and Z2b are impedances viewed from matching circuits 22 and 23 to phase circuits 14 and 15, respectively. Impedances Z3a and Z3b are impedances viewed from the phase circuits 14 and 15 to the matching circuits 24 and 25, respectively. Impedances Z4a and Z4b are impedances viewed from the matching circuits 24 and 25 to the amplifiers 12 and 13, respectively. Impedances Z5a and Z5b are impedances viewed from the amplifiers 12 and 13 to the matching circuits 24 and 25, respectively. Impedances Z6a and Z6b are impedances viewed from the matching circuits 26 and 27 (see FIG. 1) to the combiner 16, respectively.

Pass characteristics S21a and S21b are pass characteristics of the phase circuits 14 and 15, respectively, and correspond to absolute values of S-parameter S21 when the nodes N1 and N3 are a port 1 and the nodes N2 and N4 are a port 2. Pass characteristics S21A and S21B are pass characteristics of the matching circuits 24 and 25, respectively, and correspond to absolute values of the S-parameter S21.

[Description of Outphasing Operation]

Figure 3:
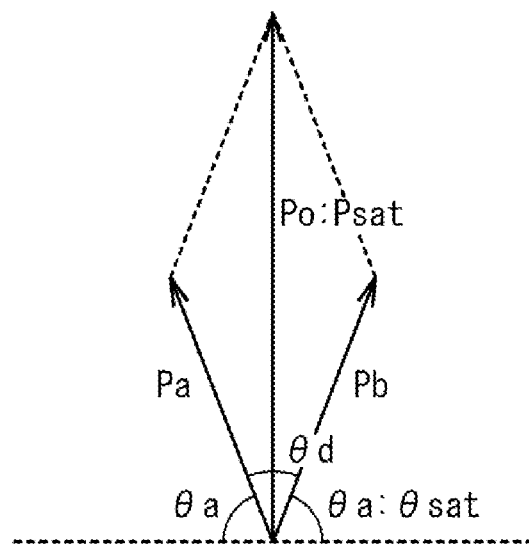
FIG. 3 is a schematic diagram illustrating vectors of output power in the first embodiment.
Figure 4:
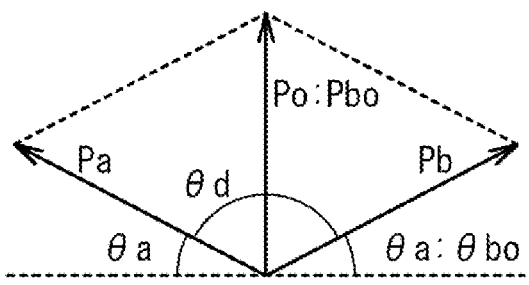
FIG. 4 is a schematic diagram illustrating vectors of output power in the first embodiment.

FIGS. 3 and 4 are schematic diagrams illustrating vectors of output power in the first embodiment. FIG. 3 corresponds to a case where the power Po of the outphasing amplifier 100 is maximized, and FIG. 4 corresponds to a case where the power P0 of the outphasing amplifier 100 is minimized. The output power Po of a maximum value used in operation is referred to as a saturation power and is represented by a power Psat. The output power Po of a minimum value used in operation is referred to as a back-off power and represented by a power Pbo.

In FIGS. 3 and 4, a power Pa is a vector of the power of the signal Soa at the node N5, and a power Pb is a vector of the power of the signal Sob at the node N6. The powers Pa and Pb are, for example, saturation powers of the amplifiers 10 and 11, respectively. A combined vector of the powers Pa and Pb is the output power Po output from the output terminal Tout. Assuming that an outphasing angle is θa and a phase difference between the powers Pa and Pb is θd, "$2 \times \theta a + \theta d = 180°$" is satisfied. That is, when the phase of a power P1 is rotated by +θa and the phase of a power P2 is rotated by −θa from a state in which the phase difference θd is 180°, the angle θa is referred to as an outphasing angle.

As illustrated in FIG. 3, when the output power Po is increased, the outphasing angle θa is increased to be closer to 90°. As illustrated in FIG. 4, when the output power Po is decreased, the outphasing angle θa is decreased to be closer to 0°. In the combiner 16 which is a Chireix combiner, when the outphasing angle is set to around 90° and around 0°, the reactance components of the impedances Z6*a* and Z6*b* become large, and the load impedances of the amplifiers 10 and 11 deviate from the optimum values. Therefore, the outphasing angle θa is used in a range of an angle θsat smaller than 90° and an angle θbo larger than 0°. That is, in FIG. 3, the outphasing angle θa when the output power Po is the power Psat is the angle θsat. The angle θsat is a maximum outphasing angle θa used in the operation of the outphasing amplifier 100. In FIG. 4, the outphasing angle θa is θbo when the output power Po is the power Pbo. The angle θbo is a minimum outphasing angle θa used in the operation of the outphasing amplifier 100. The angle θsat is, for example, 70°, and the angle θbo is, for example, 20°.

The outphasing angle θa is controlled by the signal processor 18. For example, when the output power Po is increased, the signal processor 18 increases the outphasing angle θa of the signals Sia and Sib. When the output power Po is decreased, the signal processor 18 decreases the outphasing angle θa of the signals Sia and Sib. The outphasing angle θa of the signals Sia and Sib is substantially the same as the outphasing angle θa of the signals Soa and Sob obtained by amplifying the signals Sia and Sib. Therefore, the signal processor 18 changes the outphasing angle θa of the signals Sia and Sib, so that the outphasing angle θa of the signals Soa and Sob can be changed. Thus, the signal processor 18 changes the outphasing angle θa of the signals Sia and Sib based on the input signal Si, and outputs the signals Sia and Sib with the changed outphasing angle θa to the amplifiers 10 and 11.

[Description of Chireix Combiner]

In order to describe the functions of the open stubs 36 and 37, a first comparative example will be described. In the outphasing amplifier according to the first comparative example, the open stubs 36 and 37 are not provided in the combiner 16. The combiner of the first comparative example is not the Chireix combiner.

Figure 5:
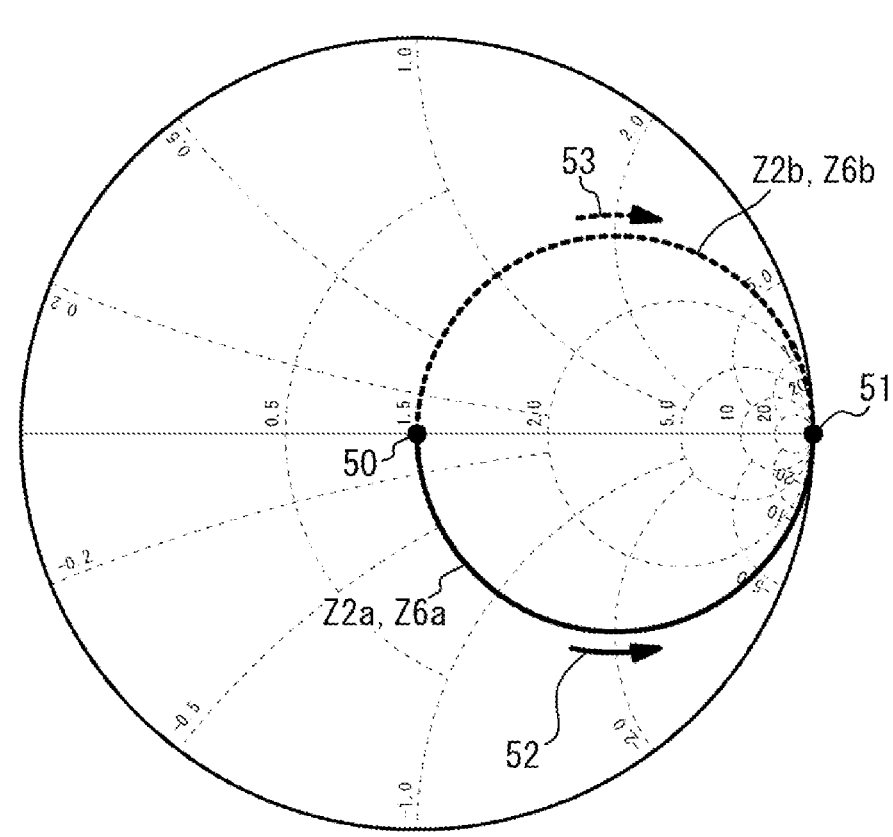
FIG. 5 is a Smith chart illustrating impedances in a first comparative example.

FIG. 5 is a Smith chart illustrating impedances in the first comparative example, and is a Smith chart illustrating the impedances Z6*a* and Z6*b*. As illustrated in FIG. 5, a point 50 indicates a case where the outphasing angle θa is 0°, and a point 51 indicates a case where the outphasing angle θa is 90°. When the outphasing angle θa changes from 0° to 90°, the impedance Z6*a* moves along the locus of a lower half of an arc from the point 50 to the point 51 as indicated by an arrow 52. The impedance Z6*b* moves along the locus of an upper half of the arc from the point 50 to the point 51 as indicated by an arrow 53.

When the impedances Z6*a* and Z6*b* are real numbers (for example, twice the standard impedance), the matching circuits 26 and 27 convert the output impedances of the amplifiers 12 and 13 so that the high frequency characteristics of the amplifiers 12 and 13 are optimized (for example, the drain efficiencies are maximized). This results in the maximum characteristics of the amplifiers 12 and 13 when the impedances Z6*a* and Z6*b* are real numbers in FIG. 5. At the points 50 and 51, the impedances Z6*a* and Z6*b* are real numbers. The range of the outphasing angle θa is a range between θsat in FIG. 3 and θbo in FIG. 4. In this range, the reactance components (imaginary components) of the impedances Z6*a* and Z6*b* are large, and the load impedances of the amplifiers 12 and 13 deviate from the optimum values. In addition, reactive power increases.

Figure 6:
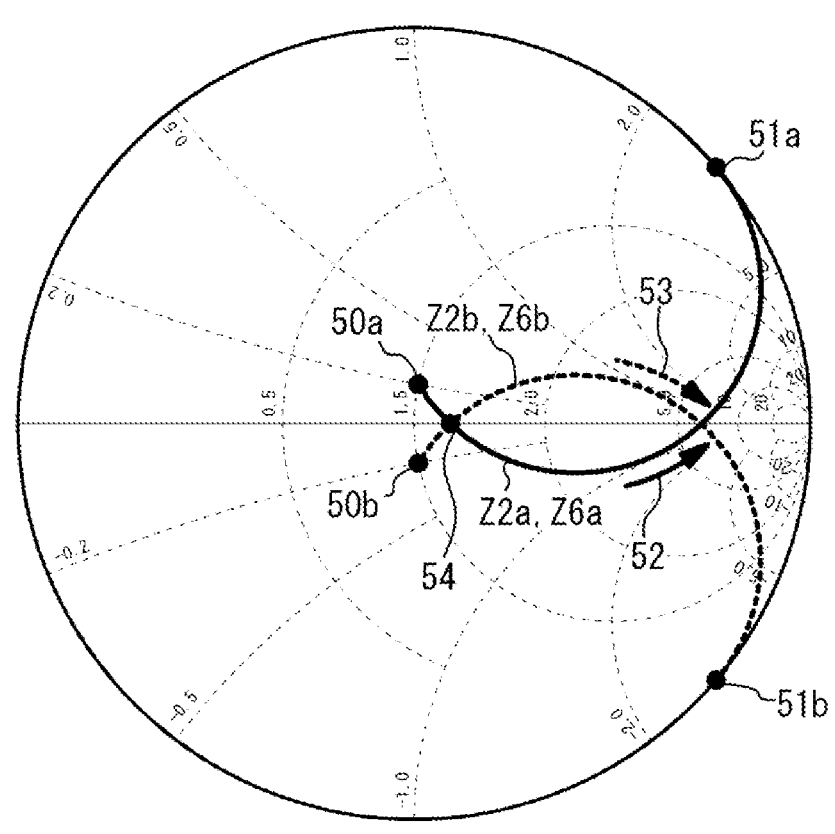
FIG. 6 is a Smith chart illustrating impedances in the first embodiment.

FIG. 6 is a Smith chart illustrating impedance in the first embodiment, and is a Smith chart illustrating the impedance Z6*a* and Z6*b*. An electrical length of the open stub 36 is an electrical length having a capacitive property, and an electrical length of the open stub 37 is an electrical length having an inductive property. That is, the open stub 36 is made longer than 2λ and shorter than 4λ. The open stub 37 is made longer than 0λ and shorter than 2λ. The "λ" is a wavelength at a center frequency of an operating frequency band of the outphasing amplifier 100.

As illustrated in FIG. 6, by providing the open stub 36, the impedance Z6*a* shifts in a positive direction and rotates in a counterclockwise direction as compared with FIG. 5 of the first comparative example in a state where the entire arc shape is maintained on the Smith chart of the impedance. By providing the open stub 37, the impedance Z6*b* shifts in a negative direction and rotates in a clockwise direction as compared with FIG. 5 of the first comparative example in a state where the entire arc shape is maintained on the Smith chart of the impedance. The reactance components of the impedance Za at a point 50*a* when the outphasing angle θa is 0° and at a point 51*a* when the outphasing angle θa is 90° are positive. The reactance components of the impedance Zb at a point 50*b* when the outphasing angle θa is 0° and at a point 51*b* when the outphasing angle θa is 90° are negative.

In the outphasing amplifier, characteristics such as efficiency are improved when the output power Po is the back-off power Pbo. Therefore, the electrical length of the open stub 36 is set to 180°−θbo, and the electrical length of the open stub 37 is set to +θbo. As a result, the impedances Z6*a* and Z6*b* when the outphasing angle θa is the angle θbo are represented by a point 54 on the real axis. Thus, when the output power Po is the back-off power Pbo, characteristics such as efficiency can be improved. The impedances Z6*a* and Z6*b* when the outphasing angle θa is θsat are not necessarily on the real axis, but are closer to the real axis than those in FIG. 5. When the outphasing angle θa is in the range between θbo and θsat, the impedances Z6*a* and Z6*b* are closer to the real axes as compared with FIG. 5 and the reactance components are reduced. Therefore, the load impedances of the amplifiers 12 and 13 are close to the optimum values. Thereby, high frequency characteristics such as drain efficiency are improved.

Description of Second Comparative Example

Figure 7:
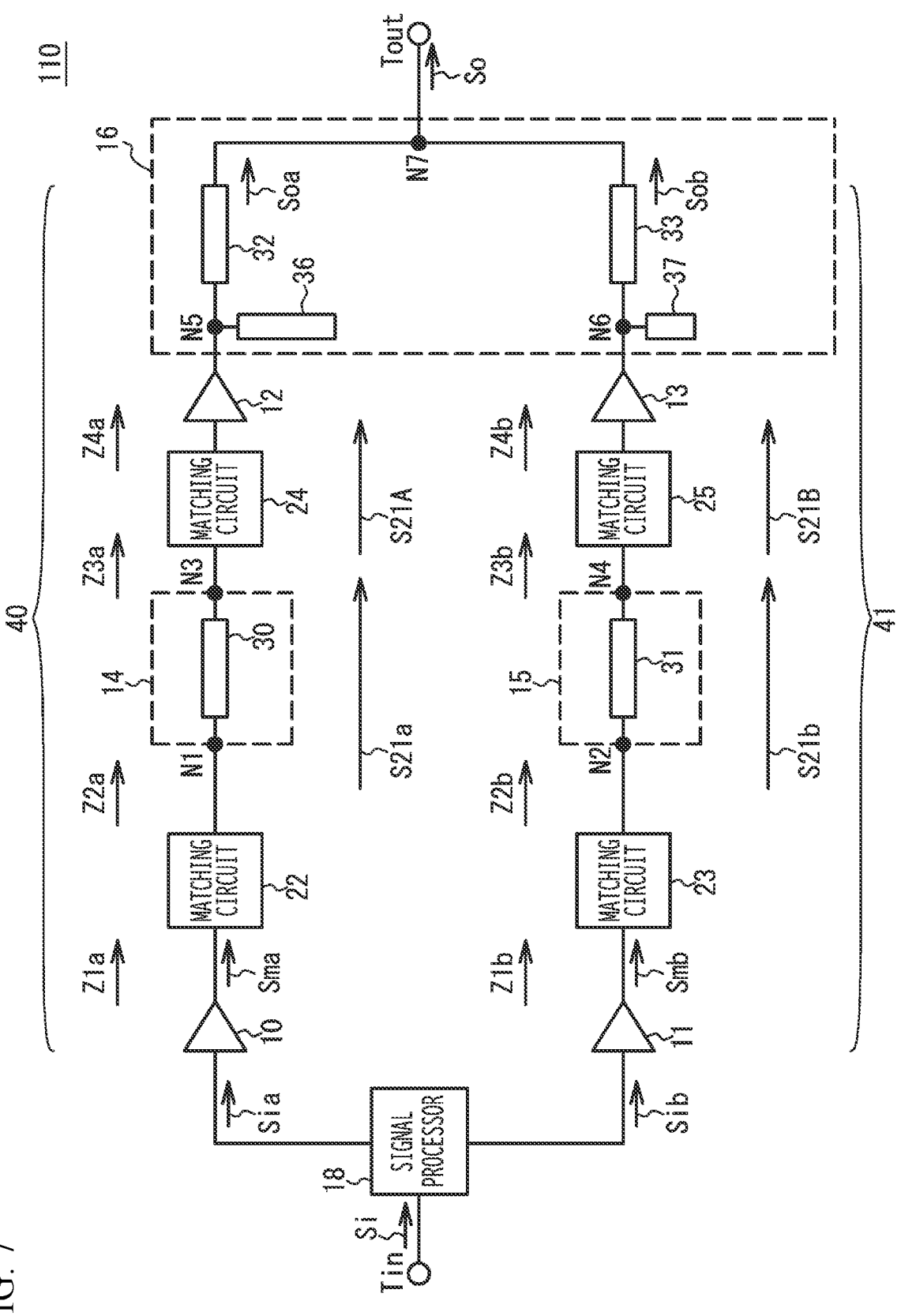
FIG. 7 is a circuit diagram illustrating an outphasing amplifier according to a second comparative example.

The functions of the matching circuits 20 and 21, the phase circuits 14 and 15, and the matching circuits 22 and 23 will be described using a second comparative example. FIG. 7 is a circuit diagram illustrating an outphasing amplifier according to a second comparative example. As illustrated in FIG. 7, in an outphasing amplifier 110 of the second comparative example, the open stub 34 is not provided in the phase circuit 14, and the open stub 35 is not provided in the phase circuit 15. Other configurations are the same as those of the first embodiment.

In the multistage amplifier, an impedance at a node between amplifiers may be used as the reference impedance. This is to facilitate the design of the matching circuit and the like. For example, it is difficult to directly match the output impedance of the amplifier 10 with the input impedance of the amplifier 12. Hereinafter, the functions of the phase circuits 14 and 15 and the matching circuits 22 and 23 will be described with reference to Smith charts of impedances Z1a to Z5a and Z1b to Z5b and pass characteristics S21A, S21B, S21A, and S21B.

Figure 8:
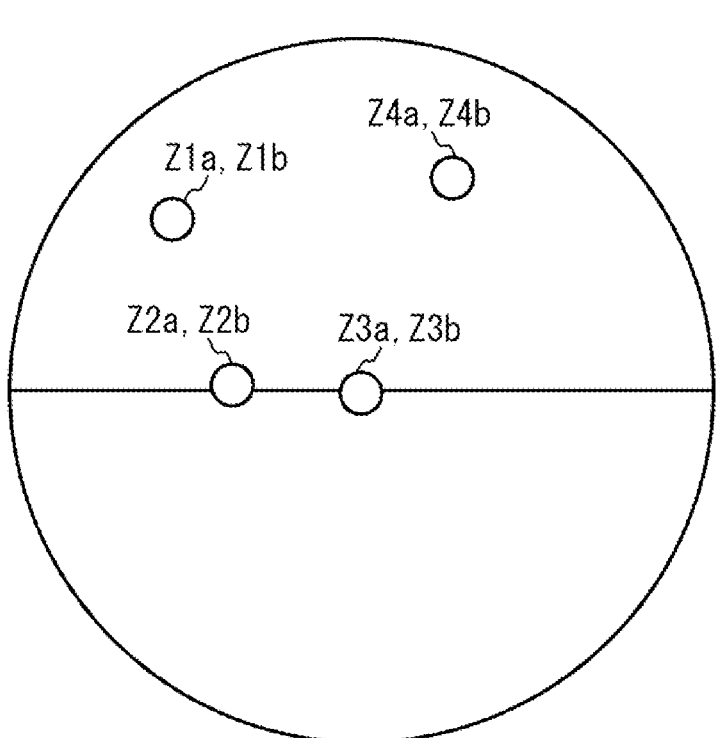
FIG. 8 is a Smith chart illustrating impedance in the outphasing amplifier according to the second comparative example.

FIG. 8 is a Smith chart illustrating impedance in the outphasing amplifier of the second comparative example. The impedances Z1a to Z4a and Z1b to Z4b are virtual impedances for explaining the functions of the matching circuits 20 and 21, the phase circuits 14 and 15, and the matching circuits 22 and 23.

The impedances Z1a to Z4a and Z1b to Z4b in FIG. 8 indicate impedances Z1a to Z4a and Z1b to Z4b when, for example, the outphasing angle θa is θbo. When the Smith chart is illustrated considering the phase difference between signals Soa and Sob (i.e., outphasing angle θa), the positions of the impedance Z1a to Z4a and the impedance Z1b to Z4b rotate on the Smith chart and become complicated as illustrated in FIG. 6. Therefore, in FIG. 8, the Smith chart is illustrated without considering the rotation by the outphasing angle θa. The same applies to the following Smith charts. A straight line in FIG. 8 corresponds to a real axis.

As illustrated in FIG. 8, the impedances Z1a and Z1b are set so that the characteristics of the amplifiers 10 and 11 are optimized (for example, the drain efficiencies are maximized). The impedances Z1a and Z1b have reactance components and are not located on the real axis.

The matching circuits 22 and 23 convert the impedances Z1a and Z1b into impedances Z2a and Z2b on the real axis, respectively, in which the reactance components of the impedances are substantially 0. Here, "on the real axis (substantially on the real axis)" may not be strictly on the real axis. For example, the reactance component (imaginary part) may be 1/10 or less of the resistance component (real part) of the impedance. Since the output impedances of the amplifiers 10 and 11 are low, the impedances Z2a and Z2b are lower than the reference impedance.

The phase circuits 14 and 15 convert the impedances Z2a and Z2b into the impedances Z3a and Z3b, respectively, which are approximately the reference impedances (e.g., 50 Ω). The impedances Z2a and Z2b and the impedances Z3a and Z3b are both located on the real axis. Therefore, the impedances Z2a and Z2b can be converted into the impedances Z3a and Z3b, respectively, by using the transmission lines 30 and 31 having the length of λ/4 as the phase circuits 14 and 15.

The matching circuits 24 and 25 convert the impedances Z3a and Z3b, which are approximately the reference impedances, into the impedances Z4a and Z4b, respectively. The impedances Z4a and Z4b are set so as to optimize the characteristics of the amplifiers 12 and 13. The impedances Z4a and Z4b have reactance components and are not located on the real axis.

Figure 9:
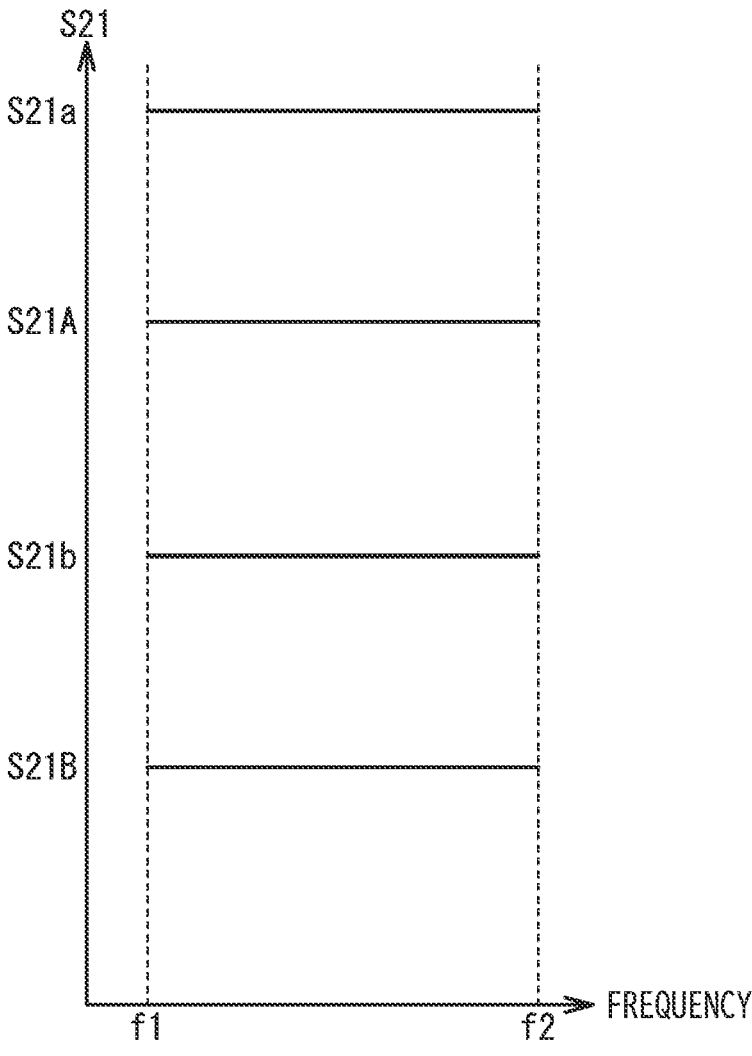
FIG. 9 is a diagram illustrating pass characteristics S21 with respect to frequencies in the outphasing amplifier according to the second comparative example.

FIG. 9 is a diagram illustrating pass characteristics S21 with respect to frequencies in the outphasing amplifier of the second comparative example. Frequencies f1 and f2 represent a low frequency end and a high frequency end of the operating frequency band of the outphasing amplifier, respectively. Pass characteristics S21A, S21b, S21A, and S21b are virtual pass characteristics for describing the functions of the matching circuits 20 and 21, the phase circuits 14 and 15, and the matching circuits 22 and 23.

As illustrated in FIG. 9, in the second comparative example, the pass characteristics S21A, S21b, S21A, and S21b are substantially constant regardless of frequencies in the operating frequency band.

In second comparative example, the outphasing operation is not considered. Therefore, as illustrated in FIG. 5, when the outphasing angle θa changes from 0° to 90° as in the impedance Z6a, the impedance Z2a moves along the locus of the lower half of the arc from the point 50 to the point 51 as indicated by the arrow 52. The impedance Z2b moves along the locus of the upper half of the arc from the point 50 to the point 51 as indicated by the arrow 53. When the outphasing angle θa is in a range between the angles θbo and θsat, the reactance components (imaginary components) of the impedances Z2a and Z2b are large, and the load impedances of the amplifiers 10 and 11 deviate from the optimum values. In addition, the reactive power increases.

[Description of Phase Circuit in First Embodiment]

In the first embodiment, the open stub 34 having the capacitive property is provided in the phase circuit 14, so that the impedance Z2a rotates in a counterclockwise direction on the Smith chart of the impedance. The open stub 35 having the inductive property is provided in the phase circuit 15, so that the impedance Z2b rotates in the clockwise direction on the Smiths chart of the impedance. Thus, when the outphasing angle θa is in the range between θbo and θsat, the impedances Z2a and Z2b are closer to the real axes as compared with FIG. 5 and the reactance components are reduced. Therefore, the load impedances of the amplifiers 10 and 11 are close to the optimum values. Thereby, the high frequency characteristics such as drain efficiency are improved.

Figure 10:
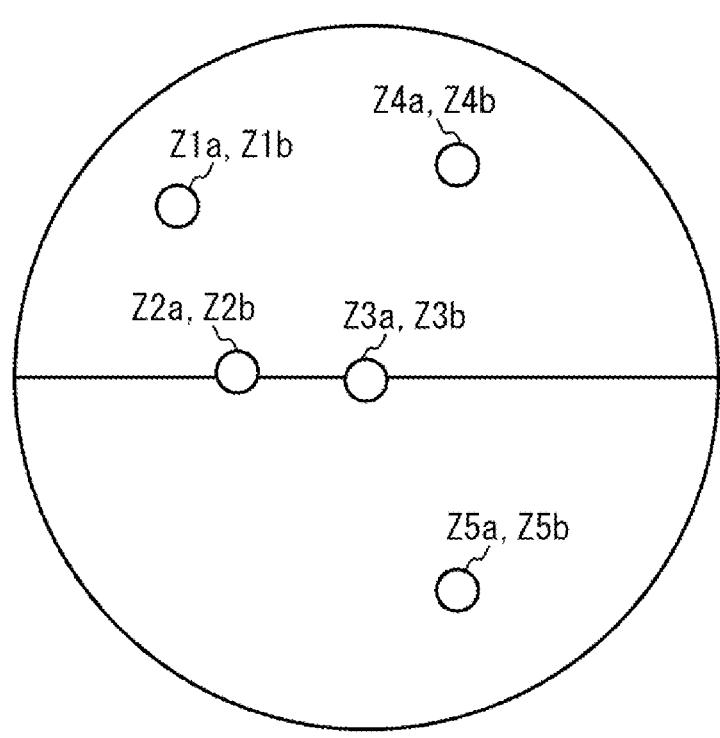
FIG. 10 is a Smith chart illustrating impedances in the outphasing amplifier according to the first embodiment.

FIG. 10 is a Smith chart illustrating impedances in the outphasing amplifier of the first embodiment. In FIG. 10, as in FIG. 8, the rotation by the outphasing angle θa is not considered. Therefore, the impedances Z1a to Z4a and the impedances Z1b to Z4b of FIG. 10 are the same as those in the second comparative example of FIG. 8. Since the impedances Z5a and Z5b and the impedances Z4a and Z4b are impedance-matched, each of the impedances Z4a and Z5a and the impedances Z4b and Z5b has a complex conjugate relationship.

Figure 11:
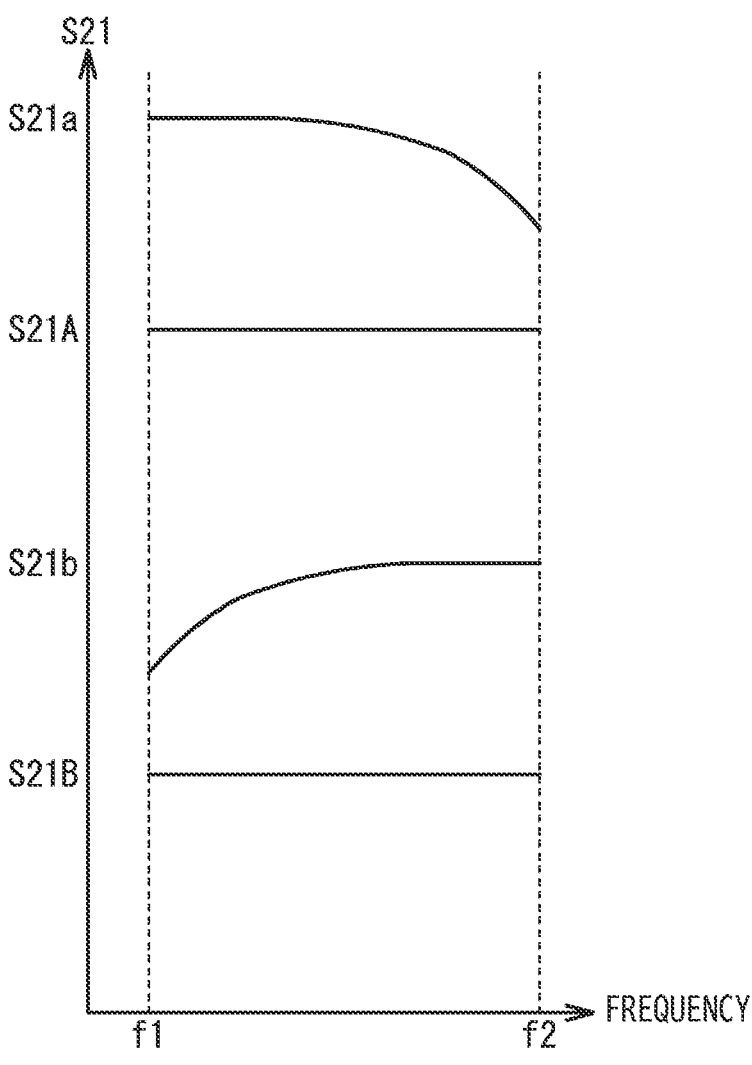
FIG. 11 is a diagram illustrating pass characteristics S21 with respect to frequencies in the outphasing amplifier according to the first embodiment.

FIG. 11 is a diagram illustrating pass characteristics S21 with respect to frequencies in the outphasing amplifier of the first embodiment. As illustrated in FIG. 11, the pass characteristic S21a is higher at the frequency f1 than at the frequency. This is because the open stub 34 has the capacitive property. The pass characteristic S21b is lower at the frequency f1 than at the frequency f2. This is because the open stub 35 has the inductive property. The pass characteristics S21A and S21B are substantially constant with respect to frequencies as in FIG. 9 of the second comparative example.

Thus, in the first embodiment, the open stubs 34 and 35 improve the high frequency characteristics such as drain efficiency, but the bandwidth is narrowed because of the presence of frequency dependence in the pass characteristics S21a and S21b.

Second Embodiment

Figure 12:
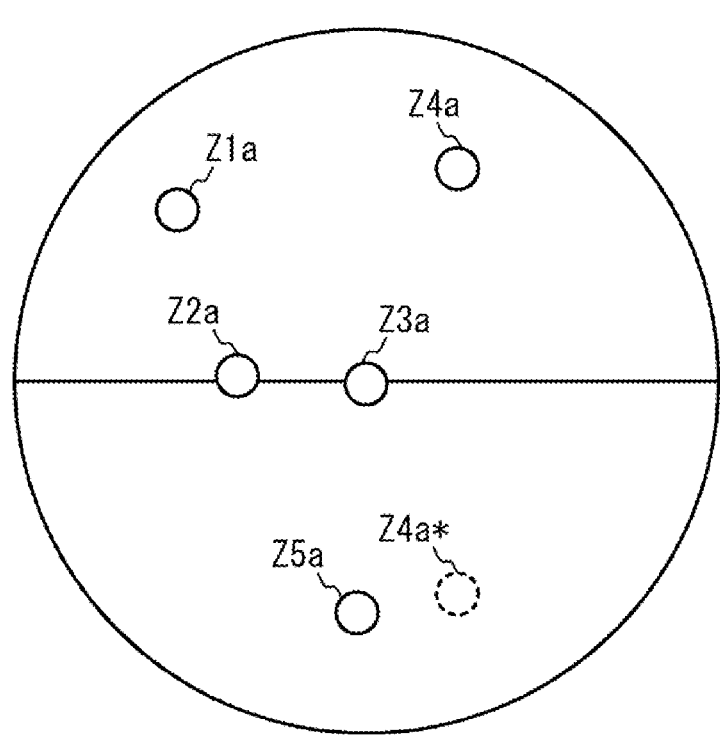
FIG. 12 is a Smith chart illustrating impedances in the outphasing amplifier according to a second embodiment.
Figure 13:
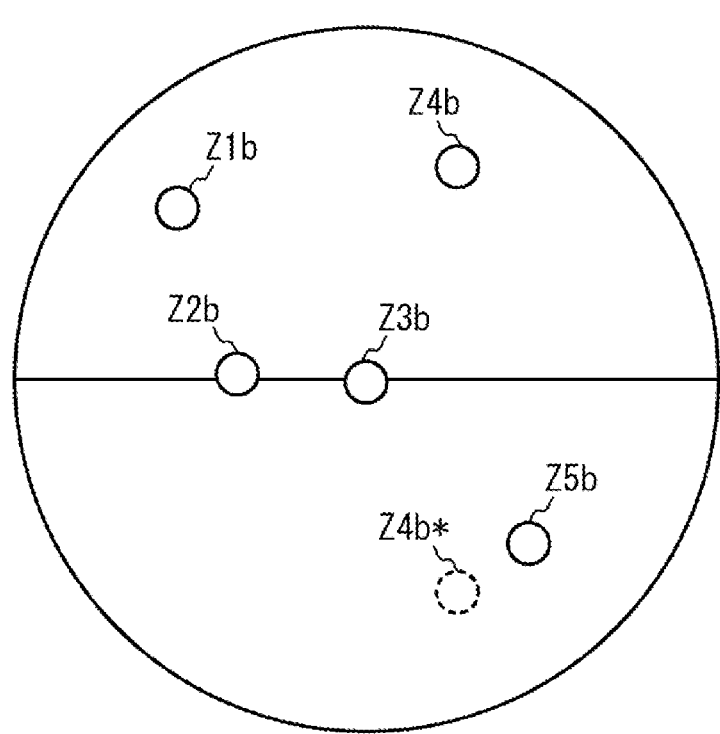
FIG. 13 is a Smith chart illustrating impedances in the outphasing amplifier according to the second embodiment.

FIGS. 12 and 13 are Smith charts illustrating impedances in the outphasing amplifier of the second embodiment. FIG. 12 illustrates the impedances Z1a to Z5a, and FIG. 13 illustrates the impedances Z1b to Z5b. In FIGS. 12 and 13, as in FIGS. 8 and 10, the rotation by the outphasing angle θa is not considered.

As illustrated in FIGS. 12 and 13, the impedances Z1a to Z4a and the impedances Z1b to Z4b are the same as those in the second comparative example and the first embodiment illustrated in FIGS. 8 and 10. As illustrated in FIG. 12, the impedance Z4a is an input impedance at which the amplifier 12 operates optimally. An impedance Z4a* is a complex conjugate of the impedance Z4a. In order for the matching circuit 24 to perform impedance matching between the phase circuit 14 and the amplifier 12, the impedance Z5a should be the impedance Z4a*. However, the matching circuit 24 in the second embodiment has more capacitive property than that in the first embodiment. Thus, the impedance Z5a is rotated clockwise more than the impedance Z4a*. That is, the phase of the high frequency signal passing through the matching circuit 24 is later than that in the first embodiment.

As illustrated in FIG. 13, the input impedance Z4b and the impedance Z4b* at which the amplifier 12 operates optimally are complex conjugates. In the second embodiment, the matching circuit 25 has more inductive property than that in the first embodiment. The impedance Z5b is rotated counterclockwise more than the impedance Z4b*. That is, the phase of the high frequency signal passing through the matching circuit 25 is faster than that in the first embodiment.

Figure 14:
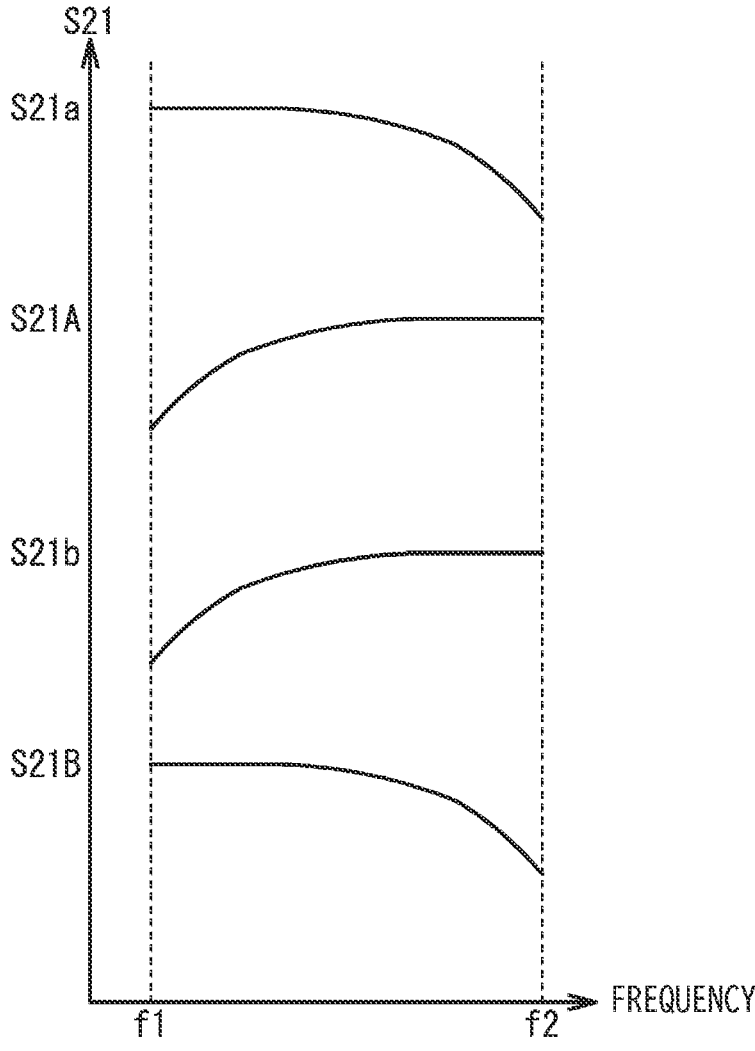
FIG. 14 is a diagram illustrating pass characteristics S21 with respect to frequencies in the outphasing amplifier according to the second embodiment.

FIG. 14 is a diagram illustrating pass characteristics S21 with respect to frequencies in the outphasing amplifier of the second embodiment. As illustrated in FIG. 14, the pass characteristics S21a and S21b are the same as those of the first embodiment. By making the matching circuit 24 have the capacitive property, the pass characteristic S21A is lower at the frequencies f1 than at the frequencies f2. By making the matching circuit 25 have the inductive property, the pass characteristic S21B is higher at the frequencies f1 than at the frequencies f2.

In the second embodiment, by providing the open stub 34, the pass characteristic S21a of the phase circuit 14 becomes a low-pass characteristic that allows low frequency signals to pass therethrough. However, by making the matching circuit 24 have the capacitive property, the pass characteristic S21A of the matching circuit 24 becomes a high-pass characteristic that allows high frequency signals to pass therethrough. This reduces the frequency dependence of the pass characteristic in the path 40. By providing the open stub 35, the pass characteristic S21b of the phase circuit 15 becomes the high-pass characteristic, but by making the matching circuit 25 have the inductive property, the pass characteristic S21B of the matching circuit 25 becomes the low-pass characteristic. This reduces the frequency dependence of the pass characteristic in the path 41. Thus, the bandwidth of the outphasing amplifier 100 can be increased.

Third Embodiment

Figure 15:
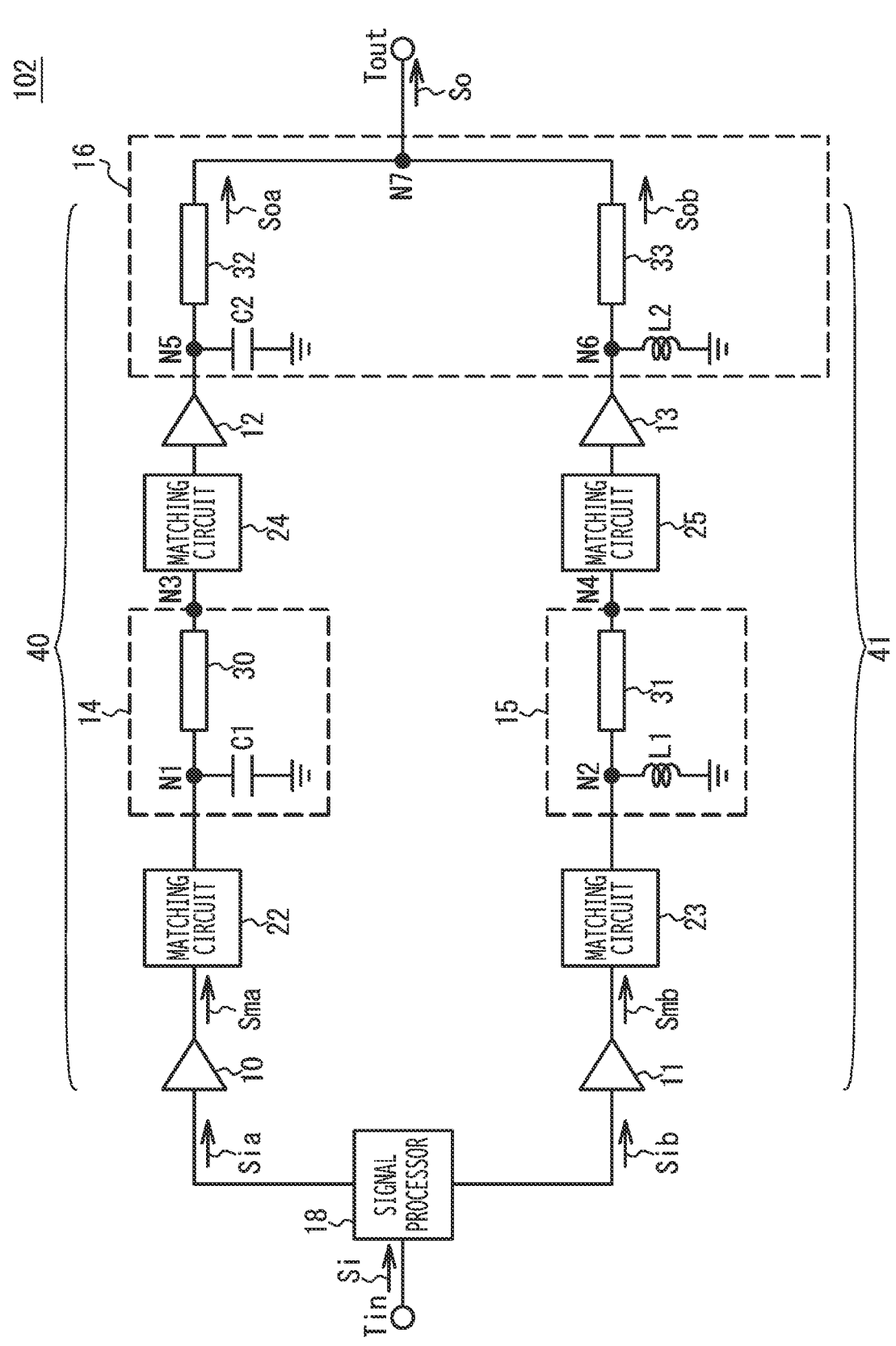
FIG. 15 is a circuit diagram illustrating an outphasing amplifier according to a third embodiment.

FIG. 15 is a circuit diagram illustrating an outphasing amplifier according to a third embodiment. As illustrated in FIG. 15, in an outphasing amplifier 102 according to the third embodiment, capacitors C1 and C2 shunt-connected to nodes N1 and N5, respectively, are provided instead of the open stubs 34 and 36. Inductors L1 and L2 shunt-connected to nodes N2 and N6, respectively, are provided instead of the open stubs 35 and 37. Other configurations are the same as those of the first and second embodiments, and description thereof is omitted.

Fourth Embodiment

Figure 16:
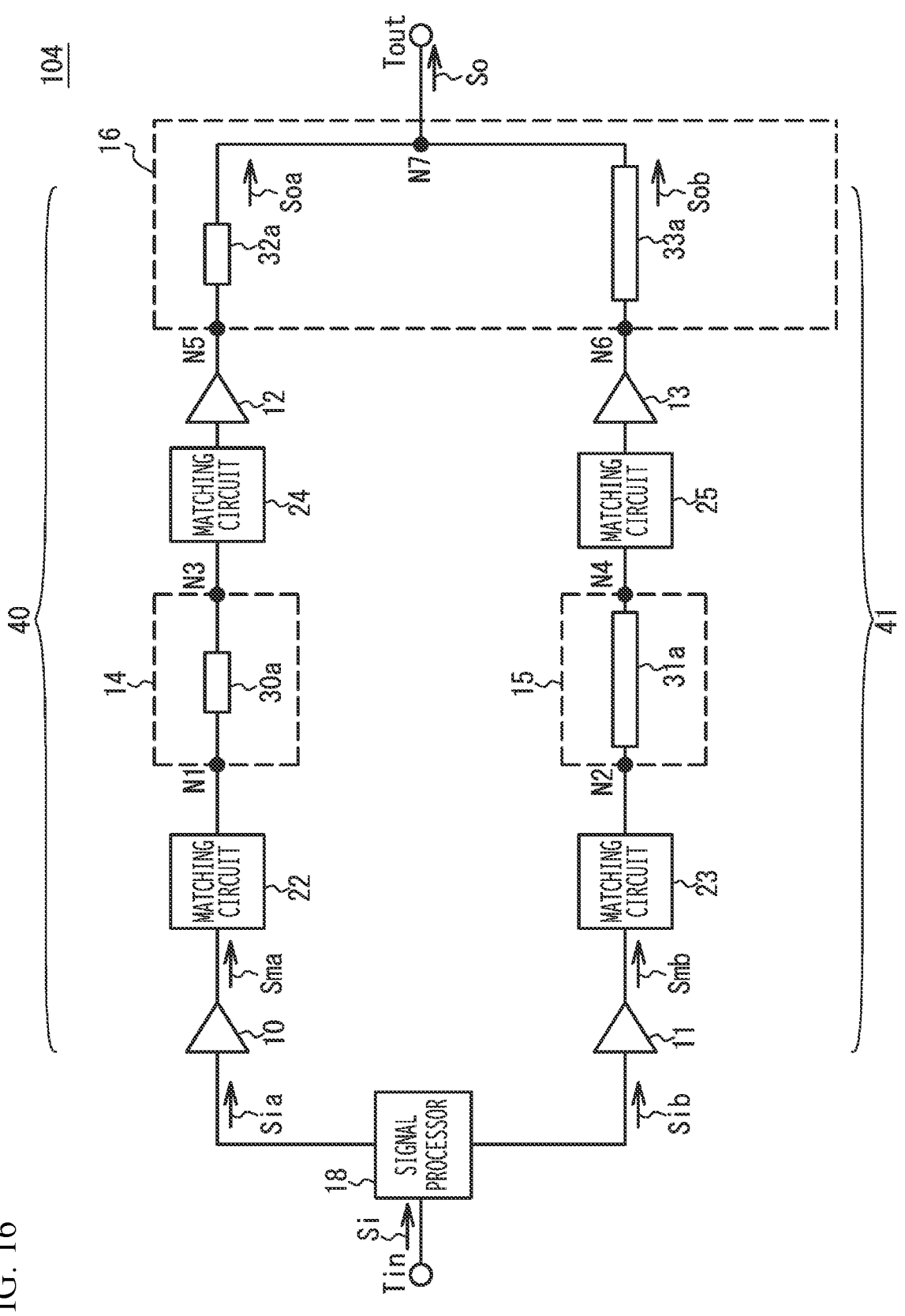
FIG. 16 is a circuit diagram illustrating an outphasing amplifier according to a fourth embodiment.

FIG. 16 is a circuit diagram illustrating an outphasing amplifier according to a fourth embodiment. As illustrated in FIG. 16, in an outphasing amplifier 104 according to the fourth embodiment, a transmission line 30a is provided instead of the transmission line 30 and the open stub 34, and a transmission line 32a is provided instead of the transmission line 32 and the open stub 36. A transmission line 31a is provided instead of the transmission line 31 and the open stub 35, and a transmission line 33a is provided instead of the transmission line 33 and the open stub 37.

The electrical lengths of the transmission lines 30a and 32a are shorter than λ/4. Thus, the transmission line 30a substantially functions as the transmission line 30 and the open stub 34, and the transmission line 32a substantially functions as the transmission line 32 and the open stub 36. The electrical lengths of the transmission lines 31a and 33a are longer than λ/4. Thus, the transmission line 31a substantially functions as the transmission line 31 and the open stub 35, and the transmission line 33a substantially functions as the transmission line 33 and the open stub 37. Other configurations are the same as those of the first and second embodiments, and description thereof is omitted.

Description of First to Fourth Embodiments

According to the first to fourth embodiments, a first phase difference $\Delta\theta1$ of the signal Sma input to the matching circuit 24 with respect to the signal Sma output from the matching circuit 22 (i.e., a phase difference between the nodes N1 and N3) is less than 90° at a center frequency f0 of the operating frequency band. A second phase difference $\Delta\theta2$ of the signal Smb input to the matching circuit 25 with respect to the signal Smb output from the matching circuit 23 (i.e., a phase difference between the nodes N2 and N4) is larger than 90° at the center frequency f0.

Thus, as illustrated in FIG. 6, the impedance Z2a can be rotated counterclockwise on the Smiths chart and the impedance Z2b can be rotated clockwise on the Smiths chart. Therefore, when the outphasing angle θa is between the angles θbo and θsat, the reactance components of the impedances Z2a and Z2b can be reduced. Thus, the high frequency characteristics of the outphasing amplifier can be improved.

From the viewpoint of reducing the reactance components of the impedances Z2a and Z2b, the phase difference $\Delta\theta1$ may be 85° or less, 80° or less, or 75° or less. The phase difference $\Delta\theta2$ may be 95° or more, 100° or more, or 105° or more. When the phase difference $\Delta\theta1$ is too small and the phase difference Δθ2 is too large, in FIG. 6, the impedances Z2a and Z2b rotate too much and the reactance components of the impedances Z2a and Z2b become large. From this viewpoint, the phase difference Δθ1 may be 45° or more, and the phase difference Δθ2 may be 135° or less.

In FIG. 6, in order to make the rotation angle of the impedance Z2a equal to the rotation angle of the impedance Z2b, |Δθ1−90°|−|Δθ2−90°| may be set to 10° or less, 5° or less, or 1° or less.

In the outphasing amplifier, the high frequency characteristics such as drain efficiency are often optimized when the output power Po is the minimum back-off power Pbo. In order to set the outphasing angle θa to the angle θbo and set the impedances Z2a and Z2b to the point 54 on the real axis in FIG. 6, the phase differences Δθ1 and Δθ2 are set to 90°−θbo and 90°+θbo, respectively.

When some errors are allowed, the phase difference Δθ1 may be 85°−θbo or more and 95°−θbo or less, 88°−θbo or more and 92°−θbo or less, or 89°−θbo or more and 91°−θbo or less. The phase difference Δθ2 may be 85°+θbo or more and 95°+θbo or less, 88°+θbo or more and 92°+θbo or less, or 89°+θbo or more and 91°+θbo or less. Thus, the high frequency characteristics of the outphasing amplifier at the back-off power Pbo can be improved.

In the second embodiment, as illustrated in FIG. 12, the impedance Z5a viewed from the amplifier 12 to the matching circuit 24 is rotated clockwise (right-handed direction) on the Smith chart from the complex conjugate (impedance Z4a*) of the impedance Z4a viewed from the matching circuit 24 to the amplifier 12. Thus, as illustrated in FIG. 14, the pass characteristic S21A can be set to the high-pass characteristic. As illustrated in FIG. 13, the impedance Z5b viewed from the amplifier 13 to the matching circuit 25 is rotated counterclockwise (left-handed direction) on the Smith chart from the complex conjugate (impedance Z4b*) of the impedance Z4b viewed from the matching circuit 25 to the amplifier 13. Thus, as illustrated in FIG. 14, the pass characteristic S21B can be set to the low-pass characteristic. Therefore, the pass characteristics of the paths 40 and 41 can be made substantially constant with respect to the frequency, and the bandwidth of the outphasing amplifier can be increased.

As in the first and second embodiments, the phase difference Δθ1 is less than 90°, and the phase difference Δθ2 is more than 90°. Thereby, the phase circuit 14 has the capacitive property and the phase circuit 15 has the inductive property. Therefore, as illustrated in FIGS. 11 and 14, the insertion loss of the signal Sma input to the matching circuit 24 with respect to the signal Sma output from the matching circuit 22 is larger at the frequency f2 of the high frequency end than at the frequency f1 of the low frequency end of the operating frequency band. The insertion loss of the signal Smb input to the matching circuit 25 with respect to the signal Smb output from the matching circuit 23 is smaller at the frequency f2 than at the frequency f1. In FIGS. 11 and 14, a decrease in the pass characteristic S21 corresponds to an increase in the insertion loss, and an increase in the pass characteristic S21 corresponds to a decrease in the insertion loss.

The pass characteristic S21a at the frequency f2 may be lower than the pass characteristic S21a at the frequency f1 by, for example, 0.5 dB or more, 1 dB or more, or 2 dB or more. The pass characteristic S21b at the frequency f1 may be lower than the pass characteristic S21b at the frequency f2 by, for example, 0.5 dB or more, 1 dB or more, or 2 dB or more.

In the second embodiment, as illustrated in FIG. 14, the insertion loss of the matching circuit 24 is smaller at the frequency f2 than at the frequency f1. The insertion loss of the matching circuit 25 is larger at the frequency f2 than at the frequency f1. As a result, the low-pass characteristic of the pass characteristic S21a and the high-pass characteristic of the pass characteristic S21A compensate each other, and the pass characteristic in the operating frequency band of the path 40 becomes constant with respect to frequencies. The high-pass characteristic of the pass characteristic S21b and the low-pass characteristic of the pass characteristic S21B compensate each other, and the pass characteristic in the operating frequency band of the path 41 becomes substantially constant with respect to frequencies. Therefore, the bandwidth of the outphasing amplifier can be increased.

The pass characteristic S21A at the frequency f1 may be lower than the pass characteristic S21A at the frequency f2 by, for example, 0.5 dB or more, 1 dB or more, or 2 dB or more. The pass characteristic S21B at the frequency f2 may be lower than the pass characteristic S21B at the frequency f1 by, for example, 0.5 dB or more, 1 dB or more, or 2 dB or more.

By setting the impedances Z3a and Z3b to substantially the reference impedance, the matching circuits 24 and 25 can be easily designed. The center of the Smith chart corresponds to the reference impedance. Therefore, when the coordinates of the impedances Z3a and Z3b on the Smith chart are represented by polar coordinates and the center of the Smith chart and the radius vector of the outer periphery are 0 and 1, respectively, the radius vector may be 0.5 or less, 0.3 or less, 0.2 or less, or 0.1 or less.

As described in the first to fourth embodiments, the first impedance converter is the transmission line 30 (first transmission line) having the electrical length of ¼ of the wave length λ at the frequency f0. The second impedance converter is the transmission line 31 (second transmission line) having the electrical length of ¼ of the wavelength A. This enables impedance conversion from the impedances Z2a and Z2b on the real axis to the impedances Z3a and Z3b on the real axis, respectively. The fact that the electrical lengths of the transmission lines 30 to 33 is ¼ (approximately ¼) of the wavelength A means that it is sufficient that the impedances Z2a and Z2b on the real axis can be substantially converted into the impedances Z3a and Z3b on the real axis. The electrical lengths of the transmission lines 30 to 33 may be converted into a phase and may be 80° or more and 100° or less, or 85° or more and 95° or less.

As in the first and second embodiments, the open stub 34 (first open stub) having a first end connected to the node N1 and the open stub 35 (second open stub) having a first end connected to the node N2 are provided. By converting the electrical length of the open stub 34 into a phase and making the phase more than 90° and less than 180°, the phase difference Δθ1 can be less than 90°. By converting the electrical length of the open stub 35 into a phase and making the phase more than 0° and less than 90°, the phase difference Δθ2 can be more than 90°.

In order to bring the impedances Z2a and Z2b of FIG. 6 closer to the real axes at the back-off power Pbo, the electrical lengths of the open stubs 34 and 35 are set to 180°−θbo and +θbo, respectively. Some errors may be allowed, the electrical length of the open stub 34 may be converted into a phase, and the electrical length of the open stub 34 may be 175°−θbo or more and 185°−θbo or less, 178°−θbo or more and 189°−θbo or less, or 179°−θbo or more and 181°−θbo or less.

As in the third embodiment, the capacitor C1 having a first end connected to the node N1 and a second end connected to the reference potential and the inductor L1 having a first end connected to the node N1 and a second end connected to the reference potential may be provided. As a result, the phase difference $\Delta\theta1$ can be less than 90° and the phase difference $\Delta\theta2$ can be more than 90°.

As in the fourth embodiment, none of the open stubs 34 and 35, the capacitor C1, and the inductor L1 may be provided in the phase circuits 14 and 15. The electric length of the transmission line 30*a* is made shorter than ¼ of the wavelength A, and the electric length of the transmission line 31*a* is made longer than ¼ of the wavelength A. Thereby, the phase difference $\Delta\theta1$ can be less than 90° and the phase difference $\Delta\theta2$ can be more than 90°.

In the back-off power Pbo, from the viewpoint of bringing the impedances Z2a and Z2b in FIG. 6 closer to the real axes, the electrical length of the transmission line 30*a* may be converted to the phase and may be 85°−θbo or more and 95°−θbo or less, 88°−θbo or more and 92°−θbo or less, or 89°−θbo or more and 91°−θbo or less. The electrical length of the transmission line 31*a* may be 85°+θbo or more and 95°+θbo or less, 88°+θbo or more and 92°+θbo or less, or 89°+θbo or more and 91°+θbo or less.

In the first to fourth embodiments, the Chireix combiner 16 that combines the signal Soa amplified by the amplifier 12 and the signal Sob amplified by the amplifier 13 is provided. Thereby, as described in FIG. 6, the load impedances of the amplifiers 12 and 13 become close to the optimum values. Thereby, the high frequency characteristics such as drain efficiency are improved.

Fifth Embodiment

Figure 17:
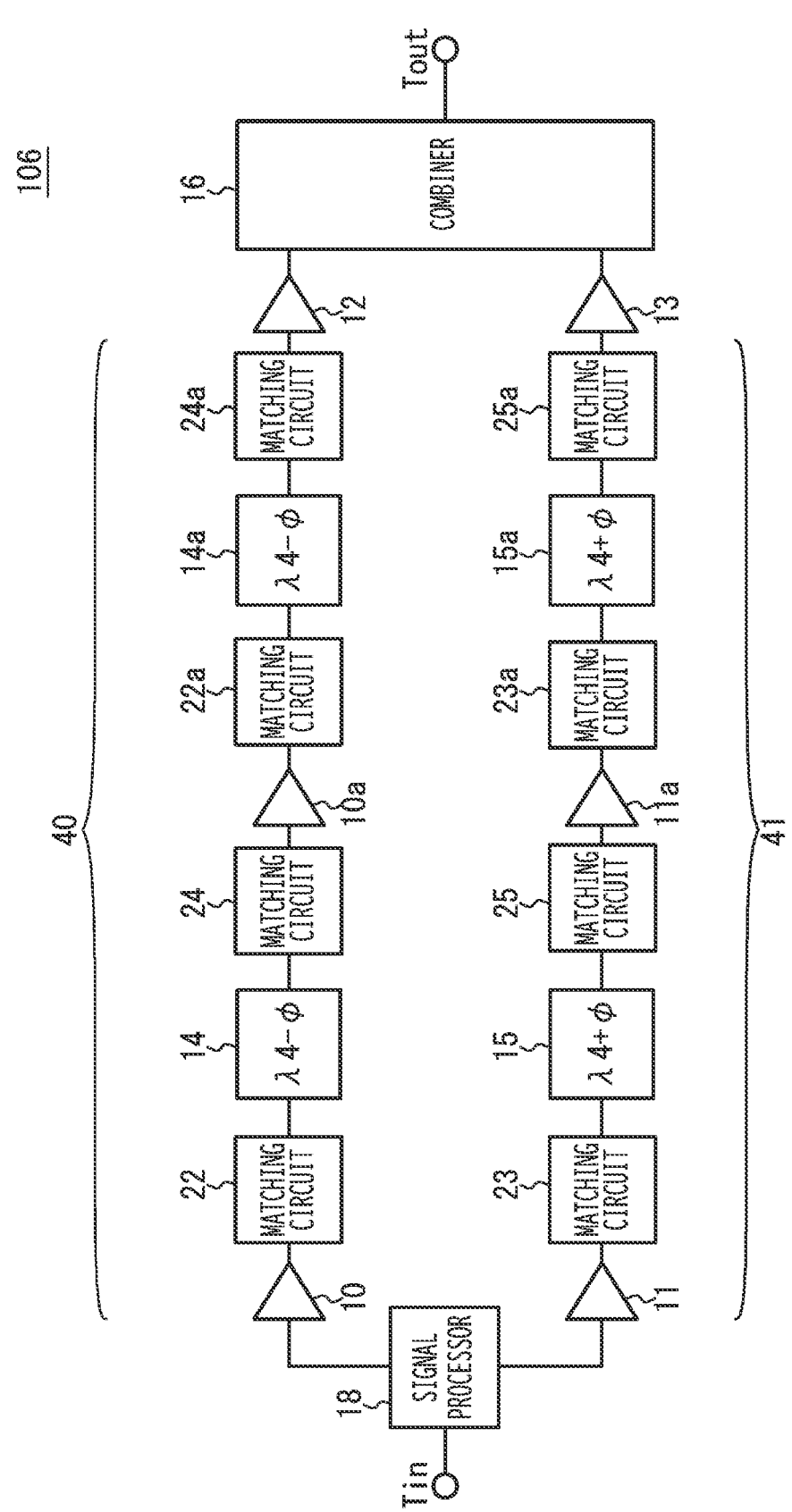
FIG. 17 is a circuit diagram illustrating an outphasing amplifier according to a fifth embodiment.

FIG. 17 is a circuit diagram illustrating an outphasing amplifier according to a fifth embodiment. As illustrated in FIG. 17, in an outphasing amplifier 106 according to the fifth embodiment, an amplifier 10*a*, a matching circuit 22*a*, a phase circuit 14*a*, and a matching circuit 24*a* are provided between the matching circuit 24 and the amplifier 12 in the path 40. In the path 41, an amplifier 11*a*, a matching circuit 23*a*, a phase circuit 15*a*, and a matching circuit 25*a* are provided between the matching circuit 25 and the amplifier 13. The functions of the amplifier 10*a*, the matching circuit 22*a*, the phase circuit 14*a*, and the matching circuit 24*a* are the same as those of the amplifier 10, the matching circuit 22, the phase circuit 14, and the matching circuit 24, respectively. The functions of the amplifier 11*a*, the matching circuit 23*a*, the phase circuit 15*a*, and the matching circuit 25*a* are the same as those of the amplifier 11, the matching circuit 23, the phase circuit 15, and the matching circuit 25, respectively.

As in the fifth embodiment, in the first to fourth embodiments, three or more stages amplifiers may be provided in the path 40, and three or more stages amplifiers may be provided in the path 41.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. An outphasing amplifier comprising:
a first amplifier configured to amplify a first signal;
a second amplifier configured to amplify a second signal;

a third amplifier configured to amplify the first signal amplified by the first amplifier;
a fourth amplifier configured to amplify the second signal amplified by the second amplifier;
a first impedance converter configured to have a first end connected to the first amplifier and a second end connected to the third amplifier;
a second impedance converter configured to have a first end connected to the second amplifier and a second end connected to the fourth amplifier;
a first matching circuit configured to match an output impedance of the first amplifier with an input impedance of the first impedance converter;
a second matching circuit configured to match an output impedance of the second amplifier with an input impedance of the second impedance converter;
a third matching circuit configured to match an output impedance of the first impedance converter with an input impedance of the third amplifier;
a fourth matching circuit configured to match an output impedance of the second impedance converter with an input impedance of the fourth amplifier; and
a combiner configured to combine the first signal amplified by the third amplifier and the second signal amplified by the fourth amplifier and output a combined signal as an output signal;
wherein a first phase difference of the first signal input to the third matching circuit with respect to the first signal output from the first matching circuit is less than 90° at a center frequency of an operating frequency band, and
a second phase difference of the second signal input to the fourth matching circuit with respect to the second signal output from the second matching circuit is more than 90° at the center frequency.

2. The outphasing amplifier according to claim 1, wherein when θbo is an outphasing angle in a case where the power of the output signal is a minimum value used for operation, the first phase difference is 85°−θbo or more and 95°−θbo or less and the second phase difference is 85°+θbo or more and 95°+θbo or less.

3. The outphasing amplifier according to claim 1, wherein an impedance viewed from the third amplifier to the third matching circuit is rotated clockwise on a Smith chart from a complex conjugate of an impedance viewed from the third matching circuit to the third amplifier, and
an impedance viewed from the fourth amplifier to the fourth matching circuit is rotated counterclockwise on the Smith chart from a complex conjugate of an impedance viewed from the fourth matching circuit to the fourth amplifier.

4. The outphasing amplifier according to claim 1, wherein an insertion loss of the first signal input to the third matching circuit with respect to the first signal output from the first matching circuit is larger at a high frequency end of the operating frequency band than at a low frequency end of the operating frequency band, and
an insertion loss of the second signal input to the fourth matching circuit with respect to the second signal output from the second matching circuit is smaller at the high frequency end than at the low frequency end.

5. The outphasing amplifier according to claim 4, wherein an insertion loss of the third matching circuit is smaller at the high frequency end than at the low frequency end, and an insertion loss of the fourth matching circuit is larger at the high frequency end than at the low frequency end.

6. The outphasing amplifier according to claim 1, wherein when coordinates on a Smith chart of an impedance viewed from the first impedance converter to the third matching circuit are expressed using polar coordinates, a radius vector is 0.5 or less, and when coordinates on the Smith chart of an impedance viewed from the second impedance converter to the fourth matching circuit are expressed using polar coordinates, a radius vector is 0.5 or less.

7. The outphasing amplifier according to claim 1, wherein the first impedance converter is a first transmission line having an electrical length of ¼ of a wavelength at the center frequency, and the second impedance converter is a second transmission line having an electrical length of ¼ of a wavelength at the center frequency.

8. The outphasing amplifier according to claim 7, further comprising:

a first open stub configured to have a first end connected to a node between the first matching circuit and the first transmission line; and a second open stub configured to have a first end connected to a node between the second matching circuit and the second transmission line.

9. The outphasing amplifier according to claim 7, further comprising:

a capacitor configured to have a first end connected to a node between the first matching circuit and the first transmission line and a second end connected to a reference potential; and an inductor configured to have a first end connected to a node between the second matching circuit and the second transmission line and a second end connected to the reference potential.

10. The outphasing amplifier according to claim 1, wherein the first impedance converter is a first transmission line having an electrical length shorter than ¼ of a wavelength at the center frequency, and the second impedance converter is a second transmission line having an electrical length longer than ¼ of a wavelength at the center frequency.

* * * * *